(12) United States Patent
Konegawa

(10) Patent No.: US 11,592,619 B2
(45) Date of Patent: Feb. 28, 2023

(54) OPTICAL WAVEGUIDE MEMBER CONNECTOR AND PRODUCING METHOD THEREOF

(71) Applicant: NITTO DENKO CORPORATION, Osaka (JP)

(72) Inventor: Naoto Konegawa, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 17/262,408

(22) PCT Filed: Jul. 25, 2019

(86) PCT No.: PCT/JP2019/029203
§ 371 (c)(1),
(2) Date: Jan. 22, 2021

(87) PCT Pub. No.: WO2020/022423
PCT Pub. Date: Jan. 30, 2020

(65) Prior Publication Data
US 2021/0294036 A1    Sep. 23, 2021

(30) Foreign Application Priority Data

Jul. 25, 2018  (JP) .............................. JP2018-139750

(51) Int. Cl.
*G02B 6/26*    (2006.01)

(52) U.S. Cl.
CPC ...................... *G02B 6/26* (2013.01)

(58) Field of Classification Search
CPC ...................................................... G02B 6/26
(Continued)

(56) References Cited

U.S. PATENT DOCUMENTS

2007/0160330 A1 * 7/2007 Yamazaki ................ H05K 1/18
385/88
2012/0141071 A1   6/2012 Duis et al.
(Continued)

FOREIGN PATENT DOCUMENTS

| | | |
|---|---|---|
| CN | 106796325 A | 5/2017 |
| JP | H06-273623 A | 9/1994 |

(Continued)

OTHER PUBLICATIONS

International Search Report Issued in PCT/JP2019/029203 dated Oct. 8, 2019.

(Continued)

*Primary Examiner* — Jerry M Blevins
(74) *Attorney, Agent, or Firm* — Edwards Neils LLC; Jean C. Edwards, Esq.

(57) ABSTRACT

An opto-electric hybrid board connector includes an opto-electric hybrid board extending along a transmission direction of light in an optical waveguide, and a connector to which an attached region of the opto-electric hybrid board is attached. The attached region has a board front end surface for inputting and outputting light to and from the optical waveguide. The connector has a connector front end surface disposed to be flush with the board front end surface. The surface roughness SRa1 of the board front end surface is 0.2 µm or more and 3 µm or less. A difference D between the surface roughness SRa1 of the board front end surface and the surface roughness SRa2 of the connector front end surface is 1 µm or less.

3 Claims, 3 Drawing Sheets

(58) Field of Classification Search
USPC .......................................................... 385/14
See application file for complete search history.

(56) References Cited

U.S. PATENT DOCUMENTS

| | | | |
|---|---|---|---|
| 2017/0307833 A1 | 10/2017 | Tsujita et al. | |
| 2017/0315316 A1 | 11/2017 | Tanaka et al. | |
| 2017/0329093 A1 | 11/2017 | Tanaka et al. | |
| 2018/0217326 A1* | 8/2018 | Brusberg | ............... G02B 6/122 |

FOREIGN PATENT DOCUMENTS

| | | | | |
|---|---|---|---|---|
| JP | H07-019711 U | 4/1995 | | |
| JP | 2005-521917 A | 7/2005 | | |
| JP | 2006-011119 A | 1/2006 | | |
| JP | 2010-091822 A | 4/2010 | | |
| JP | 2013-545147 A | 12/2013 | | |
| JP | 2016-085402 A | 5/2016 | | |
| JP | 2016-105160 A | 6/2016 | | |
| JP | 2018-084694 A | 5/2018 | | |
| JP | 2018084694 A | * 5/2018 | ............. | G02B 6/122 |
| WO | 03/085432 A2 | 10/2003 | | |
| WO | 2016/151832 A1 | 9/2016 | | |

OTHER PUBLICATIONS

Written Opinion Issued in PCT/JP2019/029203 dated Oct. 8, 2019.
International Preliminary Report on Patentability issued by WIPO dated Jan. 26, 2021, in connection with International Patent Application No. PCT/JP2019/029203.
Office Action, issued by the State Intellectual Property Office dated Dec. 30, 2021, in connection with corresponding Chinese Patent Application No. 201980048759.8.
Office Action which was issued by the Japanese Patent Office dated May 10, 2022, in connection with Japanese Patent Application No. 2018-139750.
Office Action which was issued by the Japanese Patent Office dated Oct. 4, 2022, in connection with Japanese Patent Application No. 2018-139750.

* cited by examiner

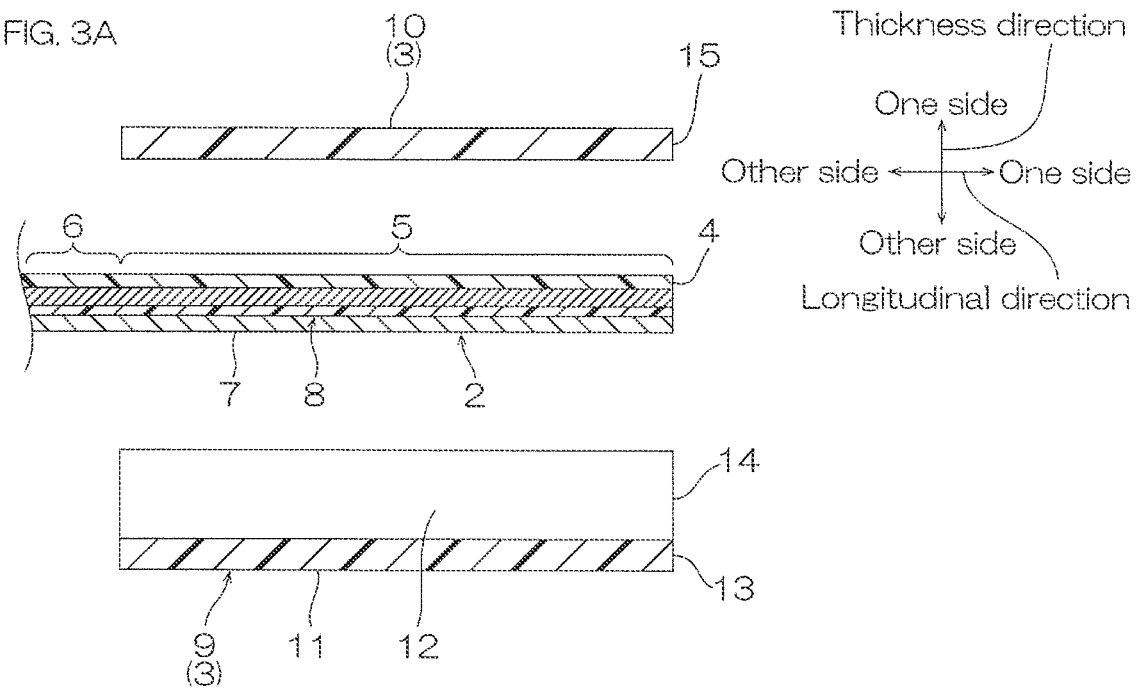
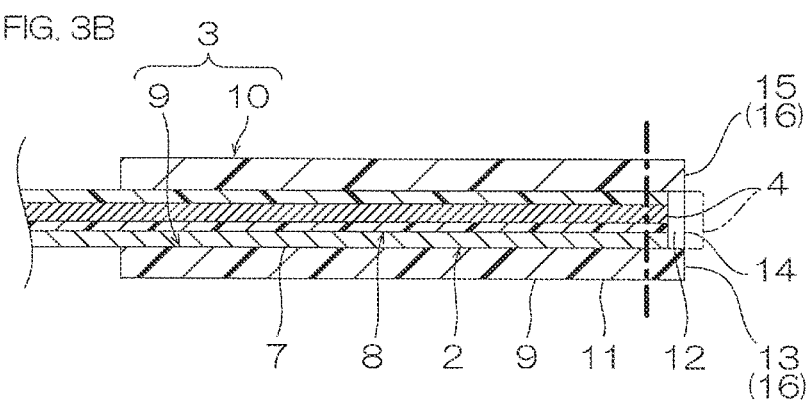

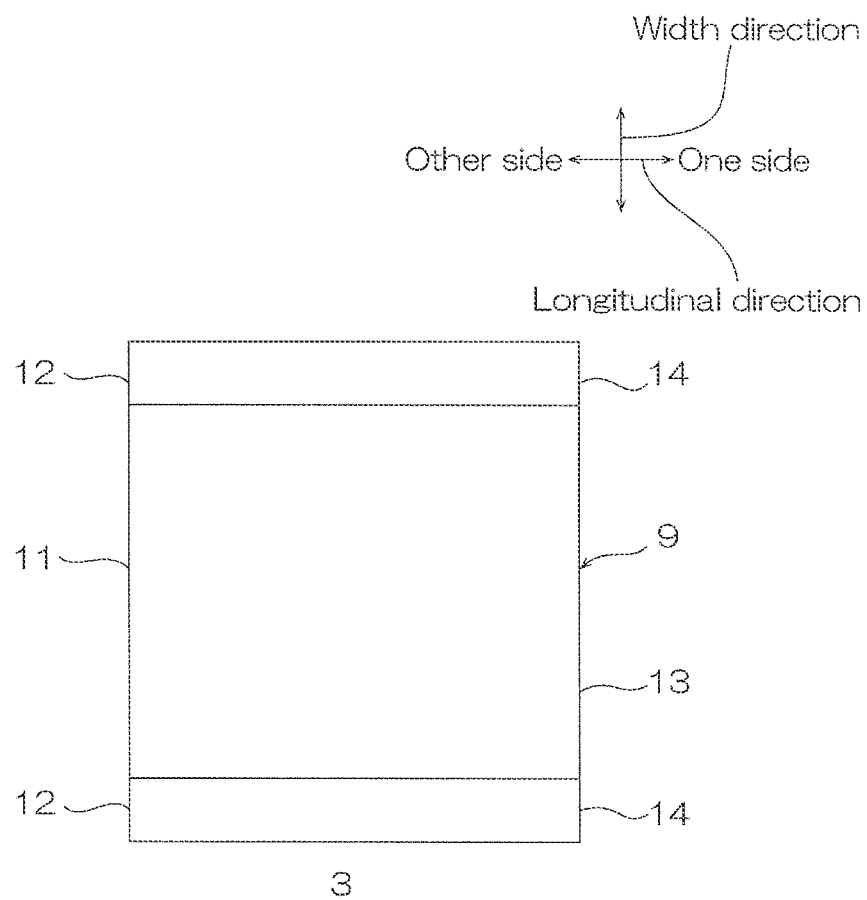
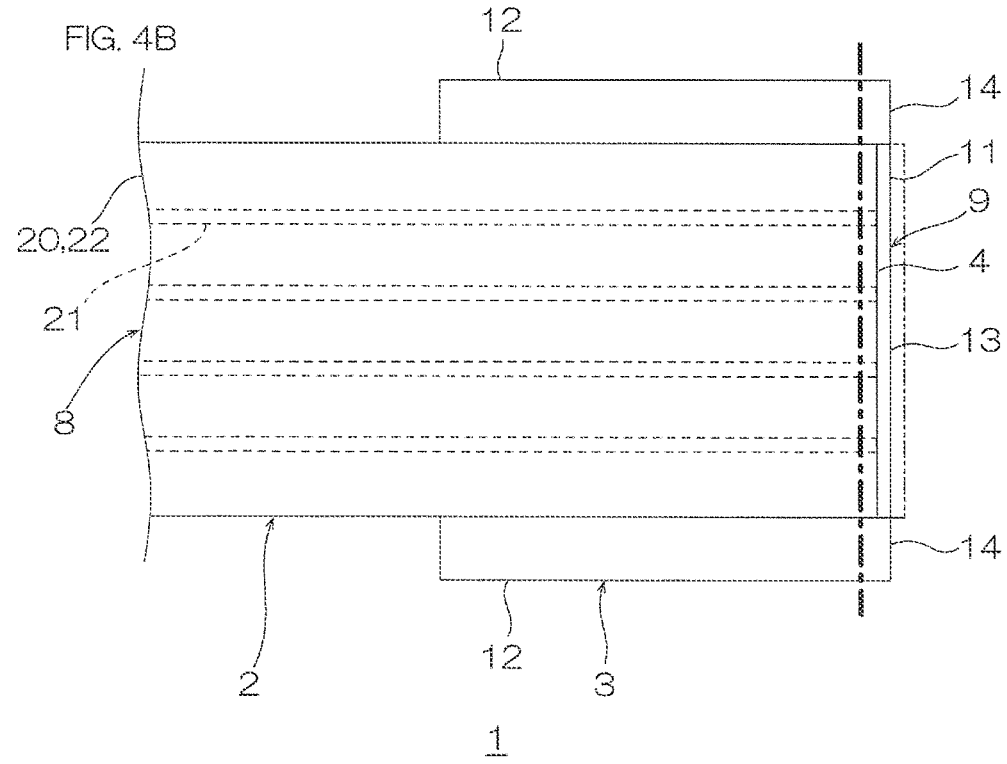

OPTICAL WAVEGUIDE MEMBER CONNECTOR AND PRODUCING METHOD THEREOF

CROSS-REFERENCE TO RELATED APPLICATIONS

The present application is a 35 U.S.C. 371 National Stage Entry of PCT/JP2019/029203, filed on Jul. 25, 2019, which claims priority from Japanese Patent Application No. 2018-139750, filed on Jul. 25, 2018, the contents of all of which are herein incorporated by reference in their entirety.

TECHNICAL FIELD

The present invention relates to an optical waveguide member connector and a method for producing an optical waveguide member connector.

BACKGROUND ART

Conventionally, an optical component including an optical connector, and an optical waveguide film having one end thereof inserted into the optical connector has been known (ref: for example, Patent Document 1).

In Patent Document 1, after cutting out an end surface of one end (optical connector front end region) of the optical waveguide film using a cutting saw, the optical connector front end region is attached to the optical connector, so that the optical component is produced.

CITATION LIST

Patent Document

Patent Document 1: Japanese Unexamined Patent Publication No. 2018-084694

SUMMARY OF THE INVENTION

Problem to be Solved by the Invention

In the optical connector described in Patent Document 1, there may be a case where it is difficult to make the end surface of the optical waveguide film flush with the end surface of the optical connector, that is, a case where the two end surfaces deviate. Specifically, the end surface of the optical waveguide film easily protrudes or easily retracts with respect to the end surface of the optical connector. On the other hand, the end surface of another optical component to be connected to the optical waveguide film and the optical connector is usually flat. Then, when the optical connector having the two deviating end surfaces is attempted to be optically connected to the other optical component, there is a problem that a gap occurs at the boundary between the end surfaces, and incoming and outgoing light is excessively lost therefrom.

Further, even when the end surface of the optical waveguide film can be flush with the end surface of the optical connector, there is also a problem that a foreign matter easily enters between the end surfaces and the end surface of the other optical component at the time of connection of these, and the incoming and outgoing light is attenuated due to such a foreign matter.

On the other hand, when the end surface of the optical waveguide film is excessively flat, there is a problem that the adhesive strength is reduced at the time of adhering to the end surface of the other optical component through an adhesive.

The present invention provides an optical waveguide member connector which is capable of suppressing a loss and the attenuation of incoming and outgoing light and having high adhesive strength with another optical member, and a method for producing an optical waveguide member connector.

Means for Solving the Problem

The present invention (1) includes an optical waveguide member connector including an optical waveguide member including an optical waveguide and extending along a transmission direction of light in the optical waveguide, and a connector to which one end portion in the transmission direction of the optical waveguide member is attached, wherein one end portion in the transmission direction of the optical waveguide member has a first end surface for inputting and outputting light to and from the optical waveguide, the connector has a second end surface disposed to be flush with the first end surface, the surface roughness $SRa1$ of the first end surface is 0.2 µm or more and 3 µm or less, and a difference between the surface roughness $SRa1$ of the first end surface and the surface roughness $SRa2$ of the second end surface is 1 µm or less.

In the optical waveguide member connector, the first end surface of the optical waveguide member and the second end surface of the connector are disposed to be flush. Therefore, the first end surface and the second end surface can be easily brought into tight contact with a second optical member. Then, it is possible to suppress the formation of a gap between the first end surface and the second end surface, and the second optical member. As a result, it is possible to reduce a loss of incoming and outgoing light.

Moreover, the surface roughness $SRa1$ of the first end surface is 3 µm or less, and the difference between the surface roughness $SRa1$ of the first end surface of the optical waveguide member and the surface roughness $SRa2$ of the second end surface of the connector is as small as 1 µm or less. Therefore, it is possible to suppress the entry of a foreign matter between the first end surface and another optical member. As a result, in the optical waveguide member connector, it is possible to further suppress the loss of the incoming and outgoing light.

Furthermore, in the optical waveguide member connector, since the surface roughness $SRa1$ of the first end surface is 0.2 µm or more, the adhesive strength is excellent at the time of adhering to the end surface of the second optical member through an adhesive.

Therefore, in the optical waveguide member connector, it is possible to suppress the attenuation of the incoming and outgoing light, and the adhesive strength with the other optical member is excellent.

The present invention (2) includes the optical waveguide member connector described in (1), wherein the optical waveguide member is an opto-electric hybrid board further including an electric circuit board.

In the optical waveguide member connector, the opto-electric hybrid board can suppress the attenuation of the incoming and outgoing light, and is excellent in the adhesive strength with the other optical member.

The present invention (3) includes a method for producing an optical waveguide member connector including the steps of preparing an optical waveguide member including an optical waveguide and extending along a transmission direction of light in the optical waveguide, and a connector; attaching one end portion in the transmission direction of the optical waveguide member to the connector; and simultaneously cutting the optical waveguide member and the connector to form a first end surface and a second end surface in each of the optical waveguide member and the connector so as to have the surface roughness SRa1 of the first end surface of 0.2 µm or more and 3 µm or less and have a difference between the surface roughness SRa1 of the first end surface and the surface roughness SRa2 of the second end surface of 1 µm or less.

In the method for producing an optical waveguide member connector, since the optical waveguide member and the connector are simultaneously cut, it is possible to easily and reliably form the first end surface and the second end surface to be flush. Therefore, the first end surface and the second end surface can be easily brought into tight contact with the second optical member. Then, it is possible to suppress the formation of a gap between the first end surface and the second end surface, and the second optical member. As a result, it is possible to reduce the loss of the incoming and outgoing light due to the gap with the second optical member.

Further, each of the first end surface and the second end surface is formed so that the surface roughness SRa1 of the first end surface is 3 µm or less, and the difference between the surface roughness SRa1 of the first end surface and the surface roughness SRa2 of the second end surface is as small as 1 µm or less. Therefore, it is possible to suppress the entry of a foreign matter between the first end surface and the other optical member. As a result, in the optical waveguide member connector, it is possible to further suppress the loss of the incoming and outgoing light.

Furthermore, since each of the first end surface and the second end surface is formed in each of the optical waveguide member and the connector so that the surface roughness SRa1 of the first end surface is 0.2 µm or more, the adhesive strength is excellent at the time of allowing the first end surface to adhere to the end surface of the second optical member through an adhesive.

Therefore, in the optical waveguide member connector obtained by the producing method, it is possible to suppress the attenuation of the incoming and outgoing light, and the adhesive strength with the other optical member is excellent.

Effect of the Invention

In the method for producing an optical waveguide member connector of the present invention and an optical waveguide member connector obtained by the producing method, it is possible to suppress the attenuation of incoming and outgoing light, and the adhesive strength with another optical member is excellent.

BRIEF DESCRIPTION OF THE DRAWINGS

FIGS. 3A to 3B show production steps of the opto-electric hybrid board connector shown in FIG. 2.

FIG. 3A illustrating a step of preparing an opto-electric hybrid board and a connector, and FIG. 3B illustrating a step of attaching the opto-electric hybrid board to the connector and cutting one end portion in the longitudinal direction.

FIGS. 4A to 4B show production steps corresponding to the opto-electric hybrid board connector shown in FIGS. 1 and 2 when viewed from the top.

FIG. 4A illustrating a step of preparing a connector, and

FIG. 4B illustrating a step of attaching an opto-electric hybrid board to the connector and cutting one end portion in the longitudinal direction.

DESCRIPTION OF EMBODIMENTS

An opto-electric hybrid board connector and a method for producing an opto-electric hybrid board connector which is one embodiment of an optical waveguide member connector and a method for producing an optical waveguide member connector of the present invention are shown in FIGS. 1 to 4B.

In FIG. 4B, a lid 10 to be described later is omitted in order to clearly show the relative arrangement of a main body 9 and a connector 3.

Figure 1:
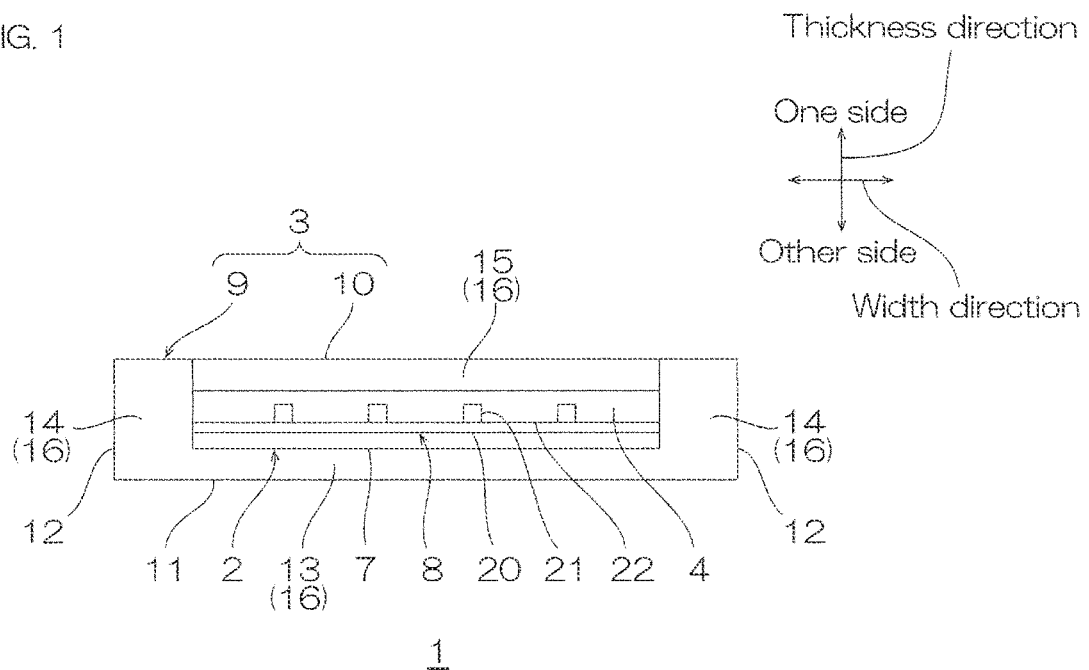
FIG. 1 shows a front view of an opto-electric hybrid board connector as one embodiment of an optical waveguide member connector of the present invention.
Figure 2:
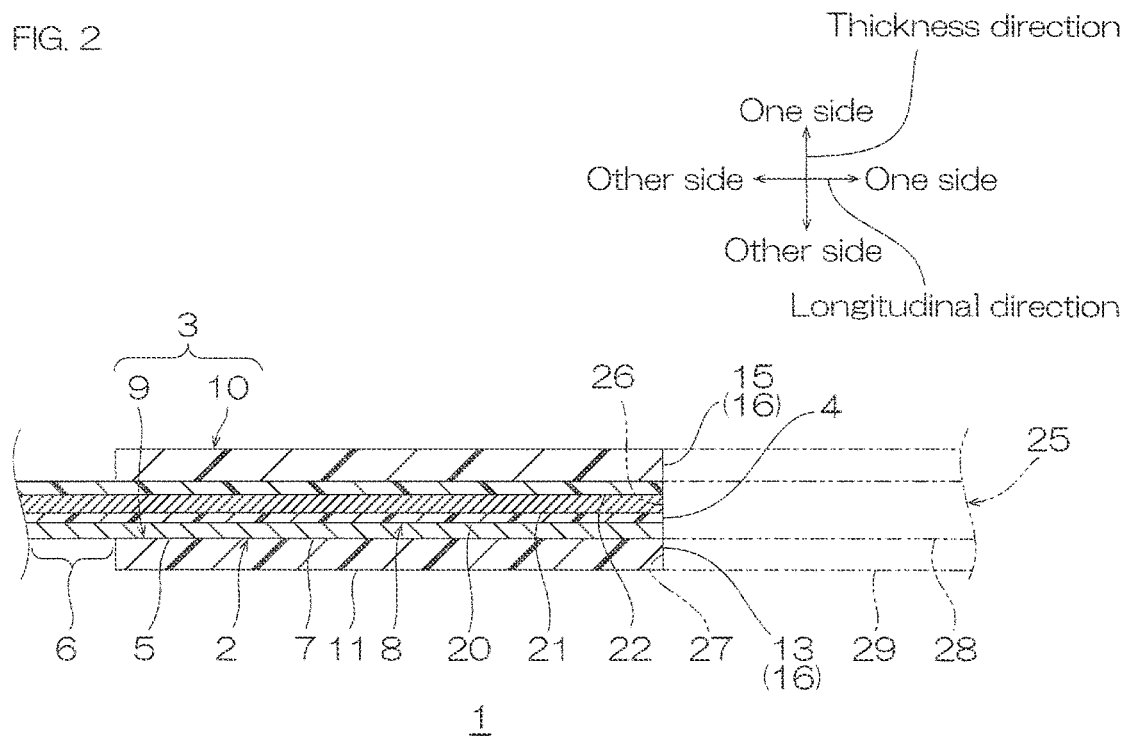
FIG. 2 shows a cross-sectional view along a longitudinal direction of the opto-electric hybrid board connector shown in FIG. 1.

As shown in FIGS. 1, 2 and 4B, an opto-electric hybrid board connector 1 includes an opto-electric hybrid board 2, and the connector 3.

The opto-electric hybrid board 2 has one surface and the other surface facing each other in a thickness direction, and has a sheet (film) shape extending in a longitudinal direction (direction perpendicular to the thickness direction) (one example of a transmission direction). Further, the opto-electric hybrid board 2 has two side surfaces connecting both end edges in a width direction (direction perpendicular to the thickness direction and the longitudinal direction) of one surface to both end edges in the width direction of the other surface. Furthermore, the opto-electric hybrid board 2 has a board front end surface 4 which is one end surface connecting one end edge in the longitudinal direction of one surface to one end edge in the longitudinal direction of the other surface, and the other end surface (not shown) connecting the other end edge in the longitudinal direction of one surface to the other end edge in the longitudinal direction of the other surface. Thus, the opto-electric hybrid board 2 integrally has six surfaces of one surface, the other surface, the two side surfaces, the board front end surface 4, and the other end surface (not shown) described above.

Further, the opto-electric hybrid board 2 integrally has an attached region 5 to be attached to the connector 3 at one end portion in the longitudinal direction, and a non-attached region 6 continuous to the other side in the longitudinal direction of the attached region 5.

The attached region 5 has one end portion in the longitudinal direction of one surface, one end portion in the longitudinal direction of the other surface, one end portions in the longitudinal direction of the two side surfaces, and the board front end surface 4 described above.

Further, the opto-electric hybrid board 2 includes an electric circuit board 7 and an optical waveguide 8 in order in the thickness direction. In one embodiment, the opto-electric hybrid board 2 includes the electric circuit board 7 and the optical waveguide 8 in order toward one side in the thickness direction. Preferably, the opto-electric hybrid board 2 includes only the electric circuit board 7 and the optical waveguide 8.

The electric circuit board 7 has a sheet (film) shape extending in the longitudinal direction. Although not shown, for example, the electric circuit board 7 includes a metal support board, a base insulating layer, a conductive layer, and a cover insulating layer in order toward the other side in the thickness direction. The details of each layer in the electric circuit board 7 are, for example, described in Japanese Unexamined Patent Publications No. 2016-105160 and No. 2016-085402.

One end surface in the longitudinal direction of the electric circuit board 7 constitutes an other-side portion in the thickness direction in the board front end surface 4.

The optical waveguide 8 is disposed on one surface in the thickness direction of the electric circuit board 7. The optical waveguide 8 has a sheet (film) shape extending in the longitudinal direction. The optical waveguide 8 is, for example, a strip-type optical waveguide, and specifically, includes an under clad layer 20, a core layer 21, and an over clad layer 22 in order toward one side in the thickness direction.

The under clad layer 20 is disposed on one surface in the thickness direction of the electric circuit board 7.

The core layer 21 is disposed on one surface in the thickness direction of the under clad layer 20. The plurality of core layers 21 are disposed at spaced intervals to each other in the width direction. The plurality of core layers 21 extend in the longitudinal direction. Thus, the optical waveguide 8 is capable of transmitting light in the longitudinal direction.

The over clad layer 22 is disposed on one surface in the thickness direction of the under clad layer 20 so as to cover one surface in the thickness direction and the two side surfaces of the core layer 21.

Examples of a material for the under clad layer 20, the core layer 21, and the over clad layer 22 include transparent resins such as an epoxy resin and an acrylic resin. Of the under clad layer 20, the core layer 21, and the over clad layer 22, the refractive index of the core layer 21 is high with respect to the refractive index of the under clad layer 20 and the over clad layer 22.

One end surfaces in the longitudinal direction of the under clad layer 20, the core layer 21, and the over clad layer 22 are flush with each other, and constitute a one-side portion in the thickness direction in the board front end surface 4.

Further, one end surface in the longitudinal direction of the optical waveguide 8 is flush with one end surface in the longitudinal direction of the electric circuit board 7. One end surface in the longitudinal direction of the optical waveguide 8 and one end surface in the longitudinal direction of the electric circuit board 7 constitute the board front end surface 4. That is, the board front end surface 4 of the opto-electric hybrid board 2 forms one surface from one end surface in the longitudinal direction of the electric circuit board 7, and one end surface in the longitudinal direction of the optical waveguide 8.

The surface roughness SRa1 of the board front end surface 4 of the opto-electric hybrid board 2 is 0.2 μm or more, preferably 0.25 μm or more, more preferably 0.5 μm or more. When the surface roughness SRa1 of the board front end surface 4 is below the lower limit described above, the adhesive strength is reduced at the time of allowing the board front end surface 4 to adhere to an optical end surface 26 (ref: FIG. 2) of an optical fiber 28 to be described later with an adhesive.

On the other hand, the surface roughness SRa1 of the board front end surface 4 of the opto-electric hybrid board 2 is 3 μm or less, preferably 2.5 μm or less, more preferably 2.0 μm or less. When the surface roughness SRa1 of the board front end surface 4 is above the upper limit described above, it is impossible to suppress the entry of a foreign matter between the board front end surface 4 and the optical end surface 26 (ref: FIG. 2) of the optical fiber 28 to be described later.

The surface roughness SRa1 of the board front end surface 4 of the opto-electric hybrid board 2 is measured based on JIS B0601 (2009).

The connector 3 is fixed and attached to the attached region 5 of the opto-electric hybrid board 2. The connector 3 includes the main body 9 and the lid 10.

The main body 9 has a generally U-shape when viewed from the front having an opening toward one side in the thickness direction. The main body 9 supports the attached region 5 of the opto-electric hybrid board 2 from the other side in the thickness direction and both outer sides in the width direction. Specifically, the main bods 9 integrally includes a bottom wall 11 and two side walls 12.

As shown in FIGS. 1, 2, and 4A, the bottom wall 11 has a generally rectangular flat plate shape extending in the longitudinal direction of the opto-electric hybrid board 2. The bottom wall 11 has one surface and the other surface facing each other at spaced intervals in the thickness direction. Furthermore, the bottom wall 11 includes a bottom wall end surface 13 which is one end surface connecting one end edge in the longitudinal direction of one surface to one end edge in the longitudinal direction of the other surface, and the other end surface connecting the other end edge in the longitudinal direction of one surface to the other end edge in the longitudinal direction of the other surface.

As shown in FIG. 2, one surface of the bottom wall 11 faces the other surface of the attached region 5 of the opto-electric hybrid board 2 in the thickness direction. On the other hand, the bottom wall end surface 13 of the bottom wall 11 is flush with the board front end surface 4 of the opto-electric hybrid board 2 in the thickness direction.

Each of the two side walls 12 has an inner-side surface facing the opto-electric hybrid board 2, and an outer-side surface facing thereto at the outside in the width direction at spaced intervals. Furthermore, the side wall 12 has a side wall end surface 14 which is one end surface connecting one end edge in the longitudinal direction of the inner-side surface to one end edge in the longitudinal direction of the outer-side surface, and the other end surface connecting the other end edge in the longitudinal direction of the inner-side surface to the other end edge in the longitudinal direction of the outer-side surface.

Each of the inner-side surfaces of the two side walls 12 faces each of the two side surfaces of the attached region 5 of the opto-electric hybrid board 2 in the width direction. On the other hand, the side wall end surface 14 of the side wall 12 is flush with the board front end surface 4 of the opto-electric hybrid board 2 in the width direction.

The lid 10 has a generally rectangular flat plate shape extending in the longitudinal direction. The lid 10 is oppositely disposed at one side in the thickness direction of the bottom wall 11 across the region where the opto-electric hybrid board 2 is accommodated. The lid 10 is parallel with the bottom wall 11. The lid 10 has one surface and the other surface facing each other at spaced intervals in the thickness direction. Further, the lid 10 has two side surfaces connecting both end edges in the width direction of one surface to both end edges in the width direction of the other surface. Furthermore, the lid 10 includes a lid front end surface 15 which is one end surface connecting one end edge in the longitudinal direction of one surface to one end edge in the longitudinal direction of the other surface, and the other end surface connecting the other end edge in the longitudinal direction of one surface to the other end edge in the longitudinal direction of the other surface.

In the connector 3, the bottom wall end surface 13 of the bottom wall 11, the side wall end surface 14 of the side wall 12, and the lid front end surface 15 form a connector front end surface 16 as one surface. The connector front end surface 16 has a generally rectangular frame shape when viewed from the front.

The connector front end surface 16 is formed to be flush with the board front end surface 4 in the thickness direction and the width direction. That is, the connector front end surface 16 and the board front end surface 4 are continuous in the thickness direction and the width direction.

As referred to FIGS. 3B and 4B, the connector front end surface 16 and the board front end surface 4 are also, for example, a cut surface formed by cutting to be described later.

The surface roughness SRa2 of the connector front end surface 16 is set so that a difference D with the surface roughness SRa1 of the board front end surface 4 to be described next is with in a desired range. Specifically, the surface roughness SRa2 of the connector front end surface 16 is, for example, 0.2 μm or more, preferably 0.25 μm or more, more preferably 0.5 μm or more, and for example, 3 μm or less, preferably 2.5 μm or less, more preferably 2 μm or less The surface roughness SRa2 of the connector front end surface 16 and the surface roughness SRa1 of the board front end surface 4 are measured based on JIS B0601 (2009).

The difference D between the surface roughness SRa1 of the board front end surface 4 and the surface roughness SRa2 of the connector front end surface 16 is 1 μm or less, preferably 0.75 μm or less, more preferably 0.5 μm or less, further more preferably 0.25 μm or less, particularly preferably 0.1 μm or less, and 0 μm or more. The difference D between the surface roughness SRa1 of the board front end surface 4 and the surface roughness SRa2 of the connector front end surface 16 is the absolute value (|SRa1−SRa2|) of the difference of these.

When the difference D between the surface roughness SRa1 of the board front end surface 4 and the surface roughness SRa2 of the connector front end surface 16 is above the upper limit described above, it is impossible to suppress the entry of a foreign matter between the board front end surface 4 and the connector front end surface 16, and another second optical member 25.

Next, a method for producing the opto-electric hybrid board connector 1 and a using method thereof are described.

As shown in FIG. 3A, in the method for producing the opto-electric hybrid board connector 1, first, the opto-electric hybrid board 2 and the connector 3 are prepared.

For example, the base insulating layer, the conductive layer, and the cover insulating layer are disposed in order in the metal support board toward the other side in the thickness direction by a known method, thereby producing the electric circuit board 7. Subsequently, the under clad layer 20, the core layer 21, and the over clad layer 22 are disposed in order in the electric circuit board 7 at one side in the thickness direction by a known method, so that the optical waveguide 8 is created with respect to the electric circuit board 7. Or, the electric circuit board 7 and the optical waveguide 8 can be separately produced to be attached to each other. Thus, the opto-electric hybrid board 2 is prepared.

At this time, the board front end surface 4 of the opto-electric hybrid board 2 may already or may not yet have the surface roughness SRa1 described above.

Separately, the main body 9 and the lid 10 having the above-described shape are prepared. At this time, the bottom wall end surface 13 and the side wall end surface 14 of the main body 9, and the lid front end surface 15 of the lid 10 may already or may not yet have the surface roughness SRa2 described above.

As shown in FIGS. 1, 3B, and 4B, next, the attached region 5 of the opto-electric hybrid board connector 1 is attached to the connector 3.

Specifically, the attached region 5 of the opto-electric hybrid board connector 1 is attached to the main body 9. Specifically, the other surface of the attached region 5 is brought into contact with one surface of the bottom wall 11 so that the side surface of the attached region 5 faces the inner-side surface of the side wall 12 of the connector 3. In this way, the attached region 5 is fitted into the connector 3.

At this time, the board front end surface 4 of the opto-electric hybrid board connector 1 may deviate from (be not flush with) the bottom wall end surface 13 and the side wall end surface 14 of the main body 9 when projected in the thickness direction and the width direction. For example, the board front end surface 4 deviates (retracts) toward the other side in the longitudinal direction with respect to the bottom wall end surface 13 and the side wall end surface 14. Or, as shown by a phantom line of FIG. 2A, the board front end surface 4 may deviate (protrude) toward one side in the longitudinal direction with respect to the bottom wall end surface 13 and the side wall end surface 14.

At the same time, the lid 10 is disposed in one end portions in the thickness direction of the opto-electric hybrid board 2 and the inner-side surface of the side wall 12 so that the opto-electric hybrid board 2 is sandwiched between the lid 10 and the bottom wall 11 in the thickness direction, and the two side surfaces of the lid 10 face the inner-side surface of the side wall 12 of the connector 3.

At this time, the board front end surface 4 of the opto-electric hybrid board 2 may deviate from (be not flush with) the lid front end surface 15 of the lid 10 when projected in the thickness direction. For example, the board front end surface 4 deviates (retracts) toward the other side in the longitudinal direction with respect to the lid front end surface 15. Or, as shown by the phantom line of FIG. 2A, the board front end surface 4 may deviate (protrude) toward one side in the longitudinal direction with respect to the lid front end surface 15.

Furthermore, though not shown, the lid front end surface 15 of the lid 10 may deviate from (be not flush with) the bottom wall end surface 13 and the side wall end surface 14 of the main body 9 when projected in the thickness direction and the width direction.

When the opto-electric hybrid board 2 and the lid 10 are disposed with respect to the main body 9, an adhesive which is not shown is disposed on one surface, the other surface, and at least one surface of the two side surfaces of the opto-electric hybrid board 2. The adhesive has transparency and does not correspond to a foreign matter to be described later. The opto-electric hybrid board 2, the lid 10, and the main body 9 are firmly bonded to each other by the adhesive.

The lid 10 and the main body 9 constitute the connector 3 having a frame shape surrounding the opto-electric hybrid board 2 when viewed from the front.

As shown by thick one-dot dashed lines of FIGS. 3B and 4B, thereafter, by simultaneously cutting one end portions in the longitudinal direction of the opto-electric hybrid board 2 and the connector 3, the board front end surface 4 having the surface roughness SRa1 described above (ref: FIG. 2) is formed in the opto-electric hybrid board 2, and the connector front end surface 16 having the surface roughness SRa2 described above (ref: FIG. 2) is formed in the connector 3.

Specifically, by cutting one end portions in the longitudinal direction of the opto-electric hybrid board 2 and the connector 3 (portion where the opto-electric hybrid board 2 and the connector 3 are overlapped with each other when projected in the thickness direction and the width direction) along the thickness direction and the width direction at one time with a cutting device, one end portions in the longitudinal direction described above are cut off. An example of the cutting device includes a dicing saw.

Thus, the board front end surface 4 having the surface roughness SRa1 described above, and the connector front end surface 16 having the surface roughness SRa2 described above are formed at the same time.

Thus, the opto-electric hybrid board connector 1 is produced.

Thereafter, as shown by the phantom line of FIG. 2, the other second optical member 25 is optically connected to the opto-electric hybrid board connector 1.

The second optical member 25 includes the optical fiber 28, and a second connector 29 disposed around the optical fiber 28. The optical end surface 26 of the optical fiber 28 and a support end surface 27 of the second connector 29 are flush with each other, and exposed. The optical end surface 26 and the support end surface 27 form one surface.

Specifically, the board front end surface 4 in the opto-electric hybrid board connector 1 is disposed to face the optical end surface 26 in the longitudinal direction, and the connector front end surface 16 is disposed to face the support end surface 27 in the longitudinal direction.

In the arrangement of these, an adhesive which is not shown is disposed on the end surface described above. The adhesive has transparency, and does not correspond to a foreign matter to be described later.

Thus, the opto-electric hybrid board connector 1 is optically connected to the second optical member 25.

In the opto-electric hybrid board connector 1, the board front end surface 4 of the opto-electric hybrid board 2 and the connector front end surface 16 of the connector 3 are disposed to be flush. Therefore, the board front end surface 4 and the connector front end surface 16 can be easily brought into tight contact with the second optical member 25. Then, it is possible to suppress the formation of a gap between the board front end surface 4 and the connector front end surface 16, and the second optical member 25. As a result, it is possible to reduce a loss of incoming and outgoing light due to the gap with the second optical member 25.

Moreover, the surface roughness SRa1 of the board front end surface 4 is 3 μm or less, and the difference D between the surface roughness SRa1 of the board front end surface 4 of the opto-electric hybrid board 2 and the surface roughness SRa2 of the connector front end surface 16 of the connector 3 is as small as 1 μm or less. Therefore, it is possible to suppress the entry of a foreign matter between the board front end surface 4, and the optical end surface 26 and the support end surface 27 of the second optical member 25. As a result, in the opto-electric hybrid board connector 1, it is possible to suppress the loss of the incoming and outgoing light.

Furthermore, in the opto-electric hybrid board connector 1, since the surface roughness SRa1 of the board front end surface 4 is 0.2 μm or more, the adhesive strength is excellent at the time of adhering to the optical end surface 26 of the optical fiber 28 through an adhesive.

Therefore, in the opto-electric hybrid board connector 1, it is possible to suppress the attenuation of the incoming and outgoing light, and the adhesive strength with the second optical member 25 is excellent.

In the method for producing the opto-electric hybrid board connector 1, since the opto-electric hybrid board 2 and the connector 3 are simultaneously cut, it is possible to easily and reliably form the board front end surface 4 and the connector front end surface 16 to be flush. Therefore, the board front end surface 4 and the connector front end surface 16 can be easily brought into tight contact with the second optical member 25. As a result, it is possible to reduce the loss of the incoming and outgoing light due to the gap between the board front end surface 4 and the connector front end surface 16, and the second optical member 25.

Further, since an overlapped portion of the opto-electric hybrid board 2 and the connector 3 is cut with a dicing saw at the same time, it is possible to set the surface roughness SRa1 of the board front end surface 4 and the surface roughness SRa2 of the connector front end surface 16 the same value or approximate value, and therefore, it is possible to set the difference D as small as 1 μm or less. Thus, it is possible to suppress the loss of the incoming and outgoing light due to the entry of the foreign matter described above.

Modified Examples

Next, modified examples of one embodiment are described. In the following modified examples, the same reference numerals are provided for members and steps corresponding to each of those in the above-described one embodiment, and their detailed description is omitted. The modified examples can be appropriately used in combination. Furthermore, the modified examples can achieve the same function and effect as that of one embodiment unless otherwise specified.

In one embodiment, the optical waveguide 8 includes the under clad layer 20, the core layer 21, and the over clad layer 22 in order toward one side in the thickness direction. Alternatively, for example, though not shown, the optical waveguide 8 can also include them in order toward the other side in the thickness direction.

Further, in one embodiment, the opto-electric hybrid board 2 includes the electric circuit board 7 and the optical waveguide 8 in order toward one side in the thickness direction. Alternatively, for example, though not shown, the opto-electric hybrid board 2 can also include them in order toward the other side in the thickness direction.

Further, in one embodiment, the opto-electric hybrid board 2 is illustrated as one example of an optical waveguide member. Alternatively, for example, though not shown, one example of the optical waveguide member includes the optical waveguide 8 without including the electric circuit board 7. Preferably, one example of an optical waveguide member is the optical waveguide 8. In this case, one example of the optical waveguide member connector is an optical waveguide connector.

Further, the opto-electric hybrid board connector 1 is not limited to those obtained only by the producing method described above. Specifically, the opto-electric hybrid board connector 1 is not limited to those obtained by the producing method in which the opto-electric hybrid board 2 and the connector 3 are simultaneously cut. Alternatively, for example, both the opto-electric hybrid board 2 and the connector 3 are separately (dividedly) cut, and the opto-electric hybrid board 2 can be also attached to the connector 3 so that the board front end surface 4 and the connector front end surface 16 are flush.

EXAMPLES

Next, the present invention is further described based on Examples and Comparative Examples shown below. The present invention is however not limited by these Examples and Comparative Examples. The specific numerical values in mixing ratio (ratio), property value, and parameter used in the following description can be replaced with upper limit values (numerical values defined as "or less" or "below") or lower limit values (numerical values defined as "or more" or "above") of corresponding numerical values in mixing ratio (ratio), property value, and parameter described in the above-described "DESCRIPTION OF EMBODIMENTS".

Example 1

The opto-electric hybrid board 2 was produced from the electric circuit board 7 and the optical waveguide 8 having the above-described shape. Further, the connector 3 having the above-described shape was produced.

Subsequently, the attached region 5 of the opto-electric hybrid board 2 was attached to the main body 9, and subsequently, the lid 10 was disposed in one end portions in the thickness direction of the opto-electric hybrid board 2 and the inner-side surface of the side wall 12. In the arrangement of the opto-electric hybrid board connector 1 and the lid 10, an adhesive was used.

Subsequently, one end portions in the longitudinal direction of the opto-electric hybrid board 2 and the connector 3 were simultaneously cut along the thickness direction and the width direction.

Thus, the opto-electric hybrid board connector 1 having the surface roughness SRa1 and SRa2 described in Table 1 was produced.

In the "Method for Producing Opto-Electric Hybrid Board Connector" in Table 1, "Simultaneously Cut" means a method of simultaneously cutting one end portions in the longitudinal direction of the opto-electric hybrid board 2 and the connector 3 after attaching the opto-electric hybrid board 2 to the connector 3, and "Separately Cut" means a method of separately cutting one end portions in the longitudinal direction of the opto-electric hybrid board 2 and the connector 3 before attaching the opto-electric hybrid board 2 to the connector 3.

Example 2 to Comparative Example 8

The surface roughness, and the producing method were changed in accordance with the description of Table 1.

<Evaluation>

First, an optical waveguide connector including a multi-mode optical fiber (GI-type, diameter of 50 μm, manufactured by MIKI Inc., FFP-G120-0500) as the optical waveguide 8 and the connector 3 was prepared. The optical waveguide 8 was optically connected to a VCSEL light source (manufactured by MIKI Inc., OP250-LS-850-MM-50-SC, emission wavelength of 850 nm).

Separately, the second optical member 29 including a multi-mode optical fiber (GI-type, diameter of 50 μm, manufactured by MIKI Inc., FFP-G120-0500) as the optical fiber 28, and the second connector 29 was prepared. The optical fiber 28 was optically connected to a light receiver (manufactured by ADVANTEST CORPORATION, optical multimeter, Q8221).

Then, an optical waveguide front end surface and a connector front end surface of the optical waveguide connector faced the optical end surface 26 and the support end surface 27 of the second optical member 29. Specifically, the board front end surface 4 and the connector front end surface 16 of the opto-electric hybrid board connector 1, the connector front end surface 16 and the board front end surface 4 of the second optical member 25, and the support end surface 27 are disposed to face each other to be optically connected to each other with an adhesive. Thereafter, the following items were evaluated, and the results are shown in Table 1.

Flush Surface

It was observed whether the connector front end surface 16 and the board from end surface 4 were flush with each other with a laser microscope (manufactured by KEYENCE CORPORATION).

Presence of Foreign Matter

It was observed whether a foreign matter was present or absent between the connector front end surface 16 and the board front end surface 4, and the optical end surface 26 and the support end surface 27 of the second optical member 25 with an optical microscope (manufactured by KEYENCE CORPORATION).

Loss of Light

Light from a VCSEL light source was received with a light receiver, its received light intensity was measured, and the loss of the light was evaluated by the following criteria.

Good: loss was below 0.2 dB

Poor: loss was 0.2 dB or more and below 1 dB

Bad: loss was 1 dB or more

Adhesive Strength

The adhesive strength (peel strength) between the opto-electric hybrid board connector 1 and the second optical member 25 was measured with a tensile tester (peel strength measuring device) to evaluate the adhesive strength under the following criteria.

Good: peel strength was 15 N or more

Bad: peel strength was below 15 N

TABLE 1

| | Surface Roughness SRa1 (μm) of Board Front End Surface of Opto-Electric Hybrid Board [μm] | Surface Roughness SRa2 (μm) of Connector Front End Surface of Connector [μm] | Difference D of Surface Roughness (\|SRa1-SRa2\|) [μm] | Method for Producing Opto-Electric Hybrid Board Connector | Evaluation | | | |
|---|---|---|---|---|---|---|---|---|
| | | | | | Relationship between Board Front End Surface and Connector Front End Surface | Foreign Matter | Optical Coupling Loss | Adhesive Strength |
| Ex. 1 | 0.25 | 0.25 | 0 | Simultaneously Cut | Flush | Absence | Good | Good |
| Comparative Ex. 1 | 0.25 | 0.25 | 0 | Separately Cut | Deviation | — | Bad | — |
| Comparative Ex. 2 | 0.05 | 0.05 | 0 | Simultaneously Cut | Flush | Absence | Poor | Bad |
| Comparative Ex. 3 | 1.1 | 0.05 | 1.05 | Separately Cut | Flush | Presence | Poor | Good |
| Ex. 2 | 0.25 | 1.2 | 0.95 | Separately Cut | Flush | Absence | Good | Good |
| Comparative Ex. 4 | 0.25 | 1.3 | 1.05 | Separately Cut | Flush | Presence | Poor | Good |
| Ex. 3 | 1.5 | 1.5 | 0 | Simultaneously Cut | Flush | Absence | Good | Good |
| Ex. 4 | 2.5 | 2.5 | 0 | Simultaneously Cut | Flush | Absence | Good | Good |
| Comparative Ex. 5 | 1.5 | 2.6 | 1.1 | Separately Cut | Flush | Presence | Poor | Good |
| Comparative Ex. 6 | 3.5 | 2.5 | 1 | Separately Cut | Flush | Absence | Poor | Good |
| Comparative Ex. 7 | 2.5 | 3.7 | 1.2 | Separately Cut | Flush | Presence | Poor | Good |
| Comparative Ex. 8 | 3.5 | 3.5 | 0 | Simultaneously Cut | Flush | Absence | Poor | Good |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The optical waveguide member connector of the present invention is, for example, used for an opto-electric hybrid board connector.

DESCRIPTION OF REFERENCE NUMBER

1 Opto-electric hybrid board connector
2 Opto-electric hybrid board
3 Connector
4 Board front end surface
7 Electric circuit board
8 Optical waveguide
16 Connector front end surface

The invention claimed is:

1. An optical waveguide member connector comprising:
an optical waveguide member including an optical waveguide and extending along a transmission direction of light in the optical waveguide, and
a connector to which one end portion in the transmission direction of the optical waveguide member is attached and such that an opposite end portion of the optical waveguide member extends beyond the connector, wherein
the connector comprises a bottom wall having and end surface, two side walls each having and end surface, and a lid having an end surface, the end surfaces of the bottom wall, the two side walls, and the lid together forming a connector end surface,
the one end portion in the transmission direction of the optical waveguide member has a first end surface for inputting and outputting light to and from the optical waveguide,
the connector end surface is disposed to be flush with the first end surface,
the surface roughness SRa1 of the first end surface is 0.2 μm or more and 3 μm or less,
a difference between the surface roughness SRa1 of the first end surface and the surface roughness SRa2 of the connector end surface is 1 μm or less, and
each of the first end surface of the optical waveguide member and the second end surface of the connector is perpendicular to the transmission direction of light.

2. The optical waveguide member connector according to claim 1, wherein
the optical waveguide member is an opto-electric hybrid board further including an electric circuit board.

3. A method for producing an optical waveguide member connector comprising the steps of:
preparing an optical waveguide member including an optical waveguide and extending along a transmission direction of light in the optical waveguide, and a connector;
attaching one end portion in the transmission direction of the optical waveguide member to the connector, such that an opposite end portion of the optical waveguide member extends beyond the connector, the connector comprising a bottom wall having and end surface, two side walls each having and end surface, and a lid having an end surface, the end surfaces of the bottom wall, the two side walls, and the lid together forming a connector end surface; and
simultaneously cutting the optical waveguide member and the connector to form a first end surface and the connector end surface for inputting and outputting light to and from the optical waveguide in each of the optical waveguide member and the connector so as to have the surface roughness SRa1 of the first end surface of 0.2 µm or more and 3 µm or less and have a difference between the surface roughness SRa1 of the first end surface and the surface roughness SRa2 of the connector end surface of 1 µm or less, and each of the first end surface of the optical waveguide member and the second end surface of the connector is perpendicular to the transmission direction of light.

\* \* \* \* \*